US010502803B2

(12) United States Patent
Guo et al.

(10) Patent No.: US 10,502,803 B2
(45) Date of Patent: Dec. 10, 2019

(54) MAGNETIC RESONANCE IMAGING BASED ON ALTERING THE SHAPE OF THE INVERSION REGION IN PULSED ARTERIAL SPIN LABELING

(71) Applicant: The Regents of the University of California, Oakland, CA (US)

(72) Inventors: Jia Guo, San Diego, CA (US); Eric C. Wong, Del Mar, CA (US)

(73) Assignee: The Regents of the University of California, Oakland, CA (US)

( * ) Notice: Subject to any disclaimer, the term of this patent is extended or adjusted under 35 U.S.C. 154(b) by 752 days.

(21) Appl. No.: 15/156,281

(22) Filed: May 16, 2016

(65) Prior Publication Data

US 2016/0334491 A1   Nov. 17, 2016

Related U.S. Application Data

(60) Provisional application No. 62/162,604, filed on May 15, 2015.

(51) Int. Cl.
*G01R 33/563* (2006.01)
*G01R 33/56* (2006.01)

(52) U.S. Cl.
CPC .... *G01R 33/56366* (2013.01); *G01R 33/5602* (2013.01)

(58) Field of Classification Search
CPC ... A61B 5/0042; A61B 5/0263; A61B 5/0402; A61B 5/055; A61B 5/7285; G01R 33/483; G01R 33/4831; G01R 33/4833; G01R 33/4836; G01R 33/4838; G01R 33/5602; G01R 33/563; G01R 33/56308; G01R 33/56316; G01R 33/56333;
(Continued)

(56) References Cited

U.S. PATENT DOCUMENTS 5,233,301 A * 8/1993 Meyer .................. G01R 33/446
                                                          324/307
5,374,889 A * 12/1994 Leach ................. G01R 33/4833
                                                          324/307
9,897,676 B2 * 2/2018 Huang ............... G01R 33/4833
(Continued)

OTHER PUBLICATIONS

Connolly et al., "Variable-Rate Selective Excitation", J Magn Reson, vol. 78, 1988, pp. 440-458.
(Continued)

*Primary Examiner* — Steven L Yeninas
(74) *Attorney, Agent, or Firm* — Perkins Coie LLP

(57) ABSTRACT

Techniques, systems and apparatus are described for magnetic resonance imaging by modifying the shape/thickness of an excitation/inversion slab. For instance, the inversion slab can be shaped as a wedge to improve temporal signal-to-noise ratio (tSNR) of arterial spin labeling (ASL) experiments by matching the temporal bolus width with the inter-pulse spacing in different feeding arteries. The shape/thickness of the excitation/inversion slab across the X-Y plane can be modified by modulating the movement of the "on-resonance" plane in space by the combination of conventional slice-selective (SS) adiabatic fast passage (AFP) and additional in-plane gradient pulses. Using this method, a computer can generate different shapes of the excitation/inversion slab.

27 Claims, 5 Drawing Sheets

(58) Field of Classification Search
CPC ........ G01R 33/56341; G01R 33/56366; G01R 33/4616; G01R 33/4824
USPC .......... 324/306–315, 318–322; 600/410, 419
See application file for complete search history.

(56) References Cited

U.S. PATENT DOCUMENTS

| | | | | |
|---|---|---|---|---|
| 2008/0150531 | A1* | 6/2008 | Hughes | G01R 33/4824 324/309 |
| 2008/0204020 | A1* | 8/2008 | Chamberlain | G01R 33/5615 324/312 |
| 2010/0253340 | A1* | 10/2010 | Corum | G01R 33/4816 324/309 |
| 2012/0283547 | A1* | 11/2012 | Wong | A61B 5/055 600/410 |
| 2013/0271133 | A1* | 10/2013 | Snyder | G01R 33/56 324/309 |
| 2014/0218028 | A1* | 8/2014 | Snyder | G01R 33/4816 324/309 |
| 2015/0125058 | A1* | 5/2015 | Christensen | G01R 33/56366 382/131 |
| 2015/0190659 | A1* | 7/2015 | Kohler | A61N 7/02 600/411 |
| 2015/0226821 | A1* | 8/2015 | Zhang | G01R 33/4816 324/309 |
| 2015/0245778 | A1* | 9/2015 | Holscher | A61B 5/0263 600/419 |
| 2015/0285881 | A1* | 10/2015 | Ott | G01R 33/30 324/309 |
| 2016/0139222 | A1* | 5/2016 | Frydman | G01R 33/483 324/309 |
| 2017/0307708 | A1* | 10/2017 | Garwood | G01R 33/4836 |

OTHER PUBLICATIONS

Garwood et al., "The return of the frequency sweep: Designing adiabatic pulses for contemporary NMR", J Magn Reson., vol. 153, 2001, pp. 155-177.

Ordidge et al., "Frequency offset corrected inversion (FOCI) pulses for use in localized spectroscopy", Magn Reson Med., vol. 36, 1996, pp. 562-566.

Tannus et al., "Adiabatic pulses", NMR Biomed, vol. 10, 1997, pp. 423-434.

Wong et al., "Implementation of quantitative perfusion imaging techniques for functional brain mapping using pulsed arterial spin labeling", NMR Biomed, vol. 10, 1997, pp. 237-249.

\* cited by examiner

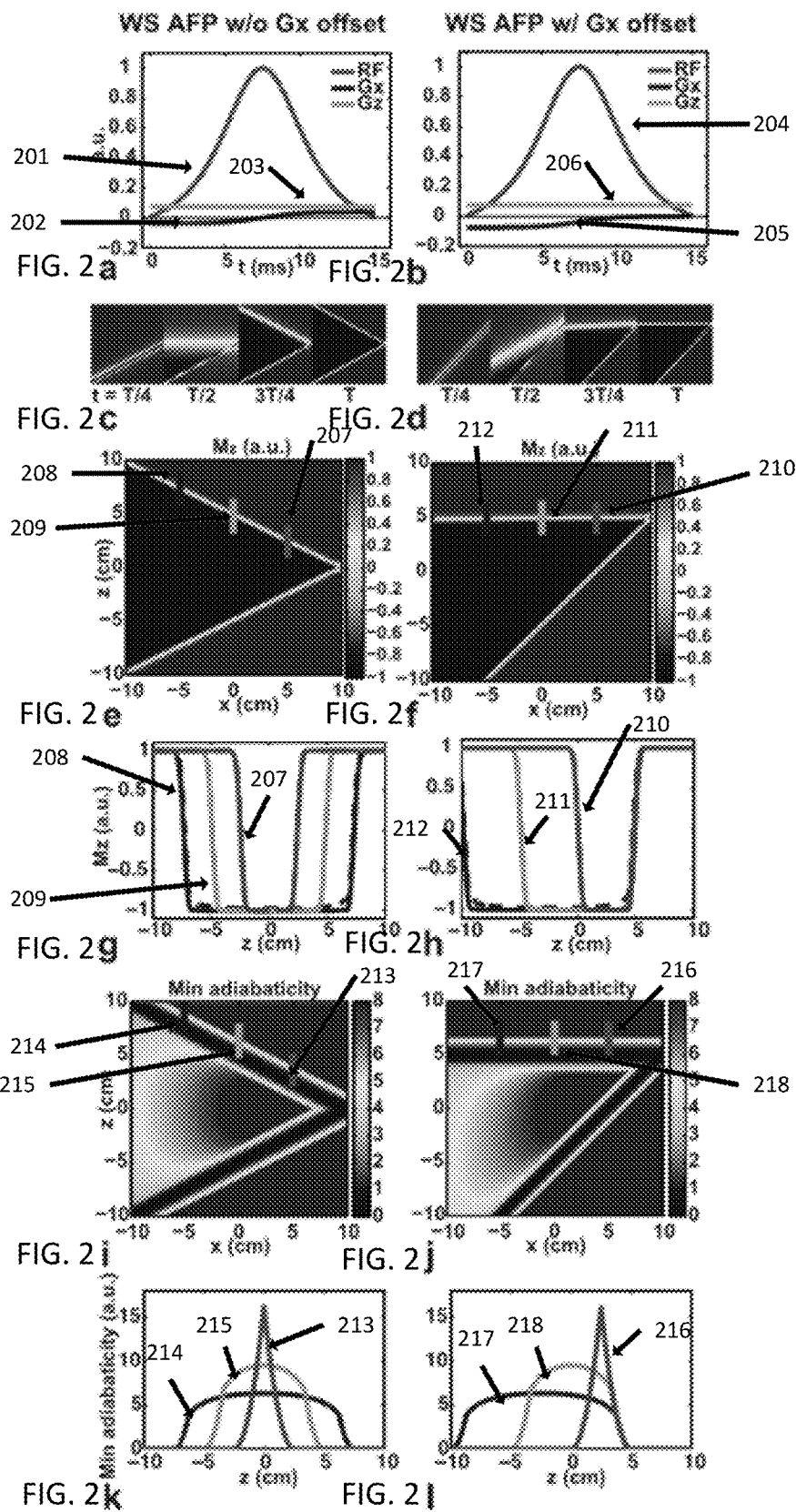

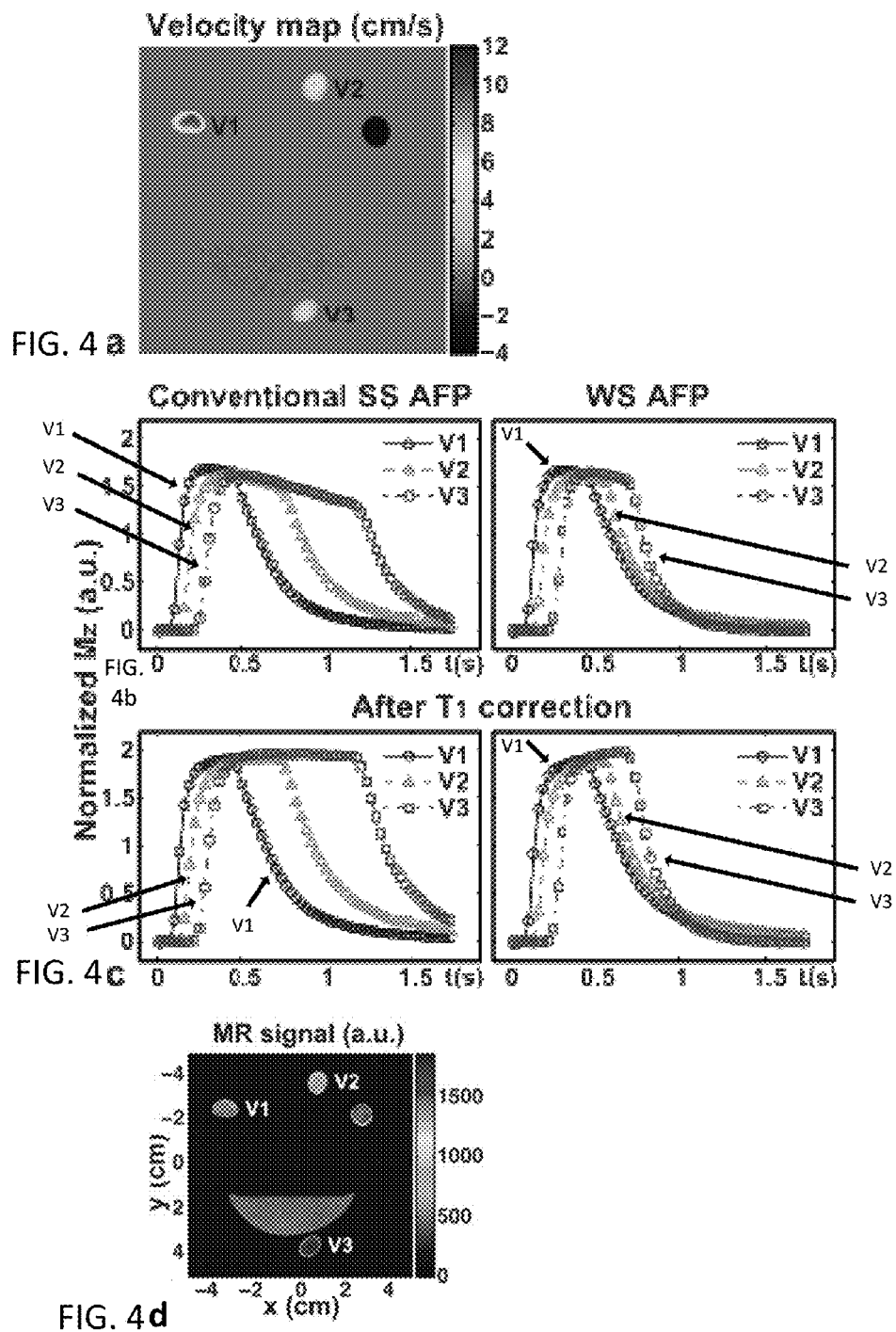

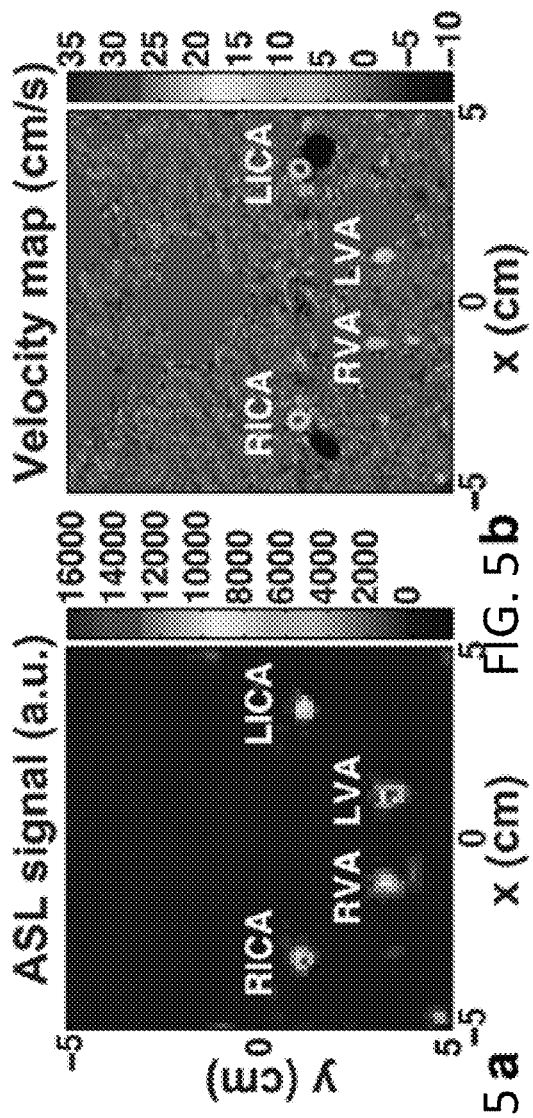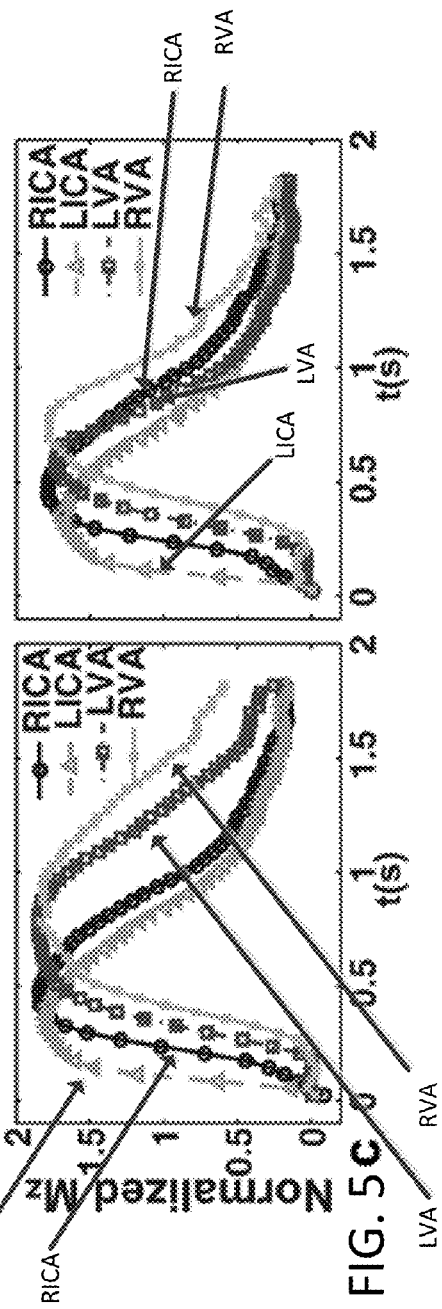
FIG. 5a  FIG. 5b  FIG. 5c

MAGNETIC RESONANCE IMAGING BASED ON ALTERING THE SHAPE OF THE INVERSION REGION IN PULSED ARTERIAL SPIN LABELING

PRIORITY CLAIM AND CROSS REFERENCE TO RELATED APPLICATIONS

This patent document claims the benefits of, and priority to, U.S. Provisional Patent Application No. 62/162,604, entitled "MAGNETIC RESONANCE IMAGING BASED ON WEDGE-SHAPED SLICE-SELECTIVE ADIABATIC INVERSION PULSE FOR BOLUS TEMPORAL WIDTH CONTROL IN PULSED ARTERIAL SPIN LABELING", filed May 15, 2015. The entire content of the aforementioned patent application is incorporated by reference as part of the disclosure of the this patent document.

STATEMENT REGARDING FEDERALLY SPONSORED RESEARCH OR DEVELOPMENT

This invention was made with government support under NIH-NS036722 awarded by the National Institute of Health. The government has certain rights in the invention.

TECHNICAL FIELD

This patent document relates to systems, devices, and processes for magnetic resonance imaging.

BACKGROUND

This application relates to techniques, apparatus and systems for magnetic resonance imaging (MRI).

Imaging through MRI techniques is well known and has been widely applied in imaging applications in medical, biological and other fields. In essence, a typical MRI technique produces an image of a selected body part of an object under examination by manipulating the magnetic spins in a body part and processing measured responses from the magnetic spins. A MRI system may include hardware to generate different magnetic fields for imaging, including a static magnetic field along a z-direction to polarize the magnetic spins, gradient fields along mutually orthogonal x, y, or z directions to spatially select a body part for imaging, and an RF magnetic field to manipulate the spins.

MRI techniques may be used to capture the functional changes in body parts or tissues such as the brain perfusion. One commonly-used technique for functional MRI is in vivo imaging by arterial spin labeling (ASL), where the arterial blood is tagged by magnetic inversion using RF pulses applied to a plane or slab of arterial blood proximal to the tissue of interest. Images are typically acquired with and without prior tagging of arterial blood and are subtracted to produce images that are proportional to perfusion. This magnetic tagging allows for the imaging of blood flow without the administration of dyes or other imaging agents. Hence, ASL provides non-invasive tagging in MRI measurements.

SUMMARY

Techniques, systems and apparatus are described for a magnetic resonance imaging (MRI) system for modifying the shape/thickness of the excitation/inversion slab to improve the temporal signal-to-noise ratio (tSNR) of arterial spin labeling (ASL) experiments.

In one aspect, the inversion slab is shaped as a wedge to improve temporal signal-to-noise ratio (tSNR) of arterial spin labeling (ASL) experiments by matching the temporal bolus width with the inter-pulse spacing in different feeding arteries. The shape/thickness of the excitation/inversion slab across the X-Y plane can be modified by modulating the movement of the "on-resonance" plane in space by the combination of conventional slice-selective (SS) adiabatic fast passage (AFP) and additional in-plane gradient pulses. Using this method, a computer can generate different shapes of the excitation/inversion slab. For example, a modulation on the inversion thickness at different in-plane gradient can generate a wedge-shaped inversion.

In another aspect, the shape of the inversion region could be altered from a slab to a wedge by adding in-plane gradients in a conventional slice-selective hyperbolic secant inversion pulse with a constant Z gradient. This exemplary method results in different inversion thickness at different locations.

In another aspect, the shape of the inversion region could be altered from a slab to a wedge by adding in-plane gradients in a conventional slice-selective hyperbolic secant inversion pulse with a non-constant Z gradient, such as VERSE-transformed SS AFP, frequency offset corrected inversion, gradient-modulated OIA. This exemplary method results in different inversion thickness at different locations.

In another aspect, after adding an in-plane gradient, a reduction in adiabaticity is minimized and adiabaticity maintains its spatial pattern by adding a linear modulation along the predetermined direction to the frequency modulation (FM) function and the Z gradient waveform from the original AFP pulse.

In another aspect, the velocities and the lengths of the feeding arteries in the inversion region can be measured and the inversion thickness can be assigned to control the bolus temporal width accurately.

In another aspect, the inversion thickness can be scaled accordingly if the velocities in the vessels should change.

In yet another aspect, a magnetic resonance imaging (MRI) system is provided to include a scanner comprising a magnet, gradient coils and a radio frequency (RF) system to perform operations comprising applying a gradient field and RF pulses generating RF pulses an tissue of interest to create a slab within the tissue of interest in which magnetic inversion is generated, modifying a shape of the slab having the magnetic inversion by modulating a plurality of in-plane gradient on a thickness of the slab, and acquiring magnetic resonance signals based on the applied RF pulses. This MRI system includes a data processing system in communication with the scanner to receive the acquired magnetic resonance signals and process the received magnetic resonance signal to generate MRI images of the tissue of interest to improve the temporal signal-to-noise ratio (tSNR).

Those and other aspects and associated implementations and benefits of the disclosed technology are described in greater detail in the drawings, the description and the claims.

BRIEF DESCRIPTION OF THE DRAWINGS

FIGS. 2a-2l are diagrams, results from Bloch simulations, and maps of the minimal adiabaticity during the WS SS AFP pulses.

FIG. 3a shows normalized $M_z$ maps after application of the conventional SS and the WS inversion pulses FIG. 3b shows the $M_z$ profiles within the phantom at the locations indicated with colored stripes shown in FIG. 3a.

FIG. 4a shows the velocity map acquired at the top edge of the inversion region and the "vessels" labels.

FIG. 4b shows normalized (control-tag) signal in each "vessel" before T1 correction, acquired with conventional SS AFP and WS AFP inversion pulses (left and right respectively).

FIG. 4c shows the same information as FIG. 4b, but after T1 correction.

FIG. 4d shows the cross sectional image acquired at the top edge of the inversion region and the "vessels" labels.

FIGS. 5a and 5b are zoomed-in images of averaged ASL signals and velocity map acquired at 2 cm distal from the inversion region in the human subject, with the arteries of interest labeled.

FIG. 5c shows normalized ASL (control-tag) signal in each artery after T1 correction, acquired with conventional SS AFP and WS AFP inversion pulses.

DETAILED DESCRIPTION

Figure 1:
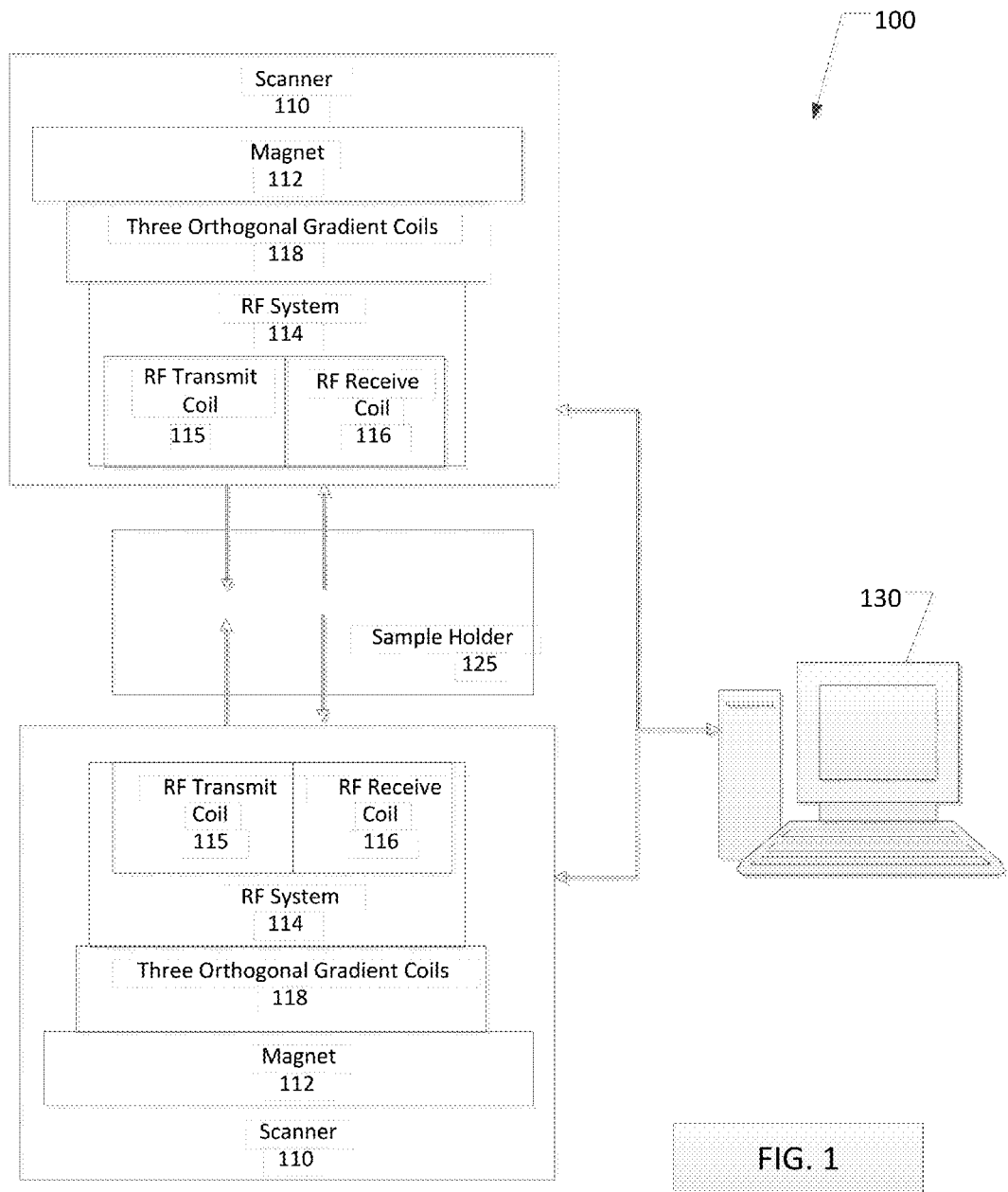
FIG. 1 is an example of an MRI System 100.

The disclosed MM imaging technology in this patent document can be implemented in various MRI systems. FIG. 1 shows an example of a MM system 100 suitable for implementing the disclosed MM imaging technology. The MRI system 100 includes a scanner 110, a data processing apparatus 130 and a sample holder or table 125 for holding a sample 120. The scanner 110 can be implemented using various MRI scanners including, e.g., a 1.5 T Sigma Twin-Speed scanner and a 3T Sigma TwinSpeed scanner (available from GE Healthcare Technologies, Milwaukee, Wis.) The scanner 110 includes a main magnet 112, three orthogonal gradient coils 118 and a RF system 114. The main magnet 112 is designed to provide a constant, homogeneous magnetic field. The three orthogonal gradient coils 118 are designed to provide three orthogonal, controller magnetic gradients used to acquire image data of a desired slice by generating an encoded and slice-selective magnetic field. The RF system 114 includes a RF transmit coil 115 and a RF receive coil designed to transmit and receive RF pulses. The RF system 114 can further include a RF synthesizer (not shown) and a power amplifier (not shown). In some implementations, an integrated transceiver coil (not shown) can be implemented instead of the separate transmit coil 115 and receive coil 116 for transmitting and receiving RF signals. For example, a close-fitting smaller coil can improve image quality when a small region is being imaged. Further, various types of coils that are placed around specific parts of a body (e.g., the head, knee, wrist, etc.) or even internally can be implemented depending on the sample and imaging applications.

The MRI system 100 can be used to perform the techniques disclosed in this specification. The RF system 114 is designed to apply to a target subject 120 a non-selective inversion RF pulse, a slice-selective inversion RF pulse and a half RF excitation pulse. The three orthogonal coils 118 are designed to apply slice-selective magnetic field gradients (of a first polarity and a second polarity) and magnetic readout gradients. The data processing apparatus (e.g., a computer) 130 is designed to receive and process the acquired data to obtain desired images corresponding to the short T2 components. The data processing apparatus (e.g., a computer) 130 can be designed to send instructions to the various components in the MRI System 100. For example, the data processing apparatus 130 can send instructions to create a wedge-shaped inversion slab to improve the temporal signal-to-noise ratio (tSNR) of arterial spin labeling (ASL) experiments.

The temporal signal-to-noise ratio (tSNR) of arterial spin labeling (ASL) experiments can be improved by repeatedly applying pulsed labeling pulses in between Look-Locker readouts. This strategy works optimally when the temporal width of the tagged boluses matches the inter-pulse spacing. However, because the feeding arteries will generally have different velocities and geometries, this cannot be accomplished using a conventional labeling slab. In order to remedy this, a novel labeling strategy is proposed by creating a wedge-shaped (WS) inversion slab, with the thickness at different arteries matching their velocities, aiming for an equal temporal bolus width that matches the inter-pulse spacing in different feeding arteries, therefore optimized tSNR.

An Exemplary Model

In conventional slice-selective (SS) adiabatic fast passage (AFP), a constant gradient pulse accompanies the AFP radiofrequency (RF) pulse for slice-selection. In the frequency-modulated frame, the frequency of the AFP RF pulse moves from one side to the other within its frequency sweeping range. In the presence of a gradient, the "on-resonance" frequency determines a plane in space where the magnetization is rapidly perturbed. This plane moves from one side of the inversion slab to the other as the frequency of the AFP pulse sweeps. With the SS gradient alone, the frequency sweeping and the "on-resonance" plane movement is identical across the X-Y plane, resulting in an excitation/inversion slab with a constant thickness.

To modify the shape/thickness of the excitation/inversion slab across the X-Y plane, the movement of the "on-resonance" plane in space can be modulated by the combination of conventional SS-AFP and additional in-plane gradient pulses. Different shapes of the excitation/inversion slab can be generated by this means. For example, a modulation on the inversion thickness at different in-plane gradient can generate a wedge-shaped inversion.

In a frequency modulation (FM) frame, the amplitude modulation (AM) and FM functions (with respect to the Larmor frequency) of the AFP pulse are $$\omega_1(t) = \gamma \cdot B_1^0 \cdot F_1(t) \hat{x}', \quad [1]$$

$$\text{and } \Delta\omega(t) = [\Omega(t) - A \cdot F_2(t)] \hat{z}', \quad [2]$$

where the $\gamma$ is the gyromagnetic ratio, $B_1^0$ and A are the amplitudes of the RF field and the FM of the AFP pulse respectively, $F_1(t)$ and $F_2(t)$ are normalized unit-less functions defining the shape of the AM and FM of the RF pulse respectively, $\Omega(t)$ is the frequency offset a localized group of spins sees at time t, and $\hat{X}$ and $\hat{z}'$ define the direction of RF field and the longitudinal component in the FM frame. The frequency offset $\Omega(t)$ can be generated from the gradient of the SS AFP pulse (through-plane (Z) gradient) and/or chemical shift. If the frequency offset is expressed as a function of an amplitude and a shape function, the following relationships can be obtained:

$$\Omega(t) = C \cdot F_3(t), \quad [3]$$

$$\Delta\omega(t) = [C \cdot F_3(t) - A \cdot F_2(t)] \hat{z}', \quad [4]$$

where C and $F_3(t)$ are the amplitude and the normalized shape function of the frequency offset. If frequency offset is generated by the Z gradient applied during the AFP at position z, then $$C = \gamma \cdot G_z \cdot z, \quad [5]$$

and $F_3(t)$ is the shape of the Z gradient.

To introduce the inversion thickness modulation in the X-Y plane (for simplicity, only the gradient along the X direction is considered), various gradient waveforms can be utilized. However, given a predesigned SS AFP pulse, it is desirable to minimize the reduction in adiabaticity and maintain its spatial pattern after adding the in-plane gradient. To achieve this, a linear modulation along the X direction can be added to the FM function and the Z gradient waveform from the original AFP pulse:

$$G_x(t) = G_x \cdot \left[F_2(t) - \alpha \frac{C}{A} \cdot F_3(t)\right] = G_x \cdot \left[F_2(t) - \alpha \frac{\gamma \cdot G_z \cdot z}{A} \cdot F_3(t)\right], \quad [6]$$

where $G_x$ is the amplitude of the X gradient and $\alpha$ is a unit-less factor offsetting the FM waveform by a multitude of the Z gradient waveform that controls the shear of the inversion region.

Adding the frequency offset induced by the X gradient into Equation 4, now the combined FM function at location x is $$\Delta\omega(x, t) = \quad [7]$$
$$[C \cdot F_3(t) + \gamma \cdot x \cdot G_x(t) - A \cdot F_2(t)]\hat{z}' = [C' \cdot F_3(t) - A' \cdot F_2(t)]\hat{z}',$$
where $$C' = C \cdot \left(1 - \frac{\alpha \cdot \gamma \cdot G_x}{A} \cdot x\right) = \gamma \cdot G_z \cdot z \cdot \left(1 - \frac{\alpha \cdot \gamma \cdot G_x}{A} \cdot x\right), \quad [8]$$

and $A' = A \cdot \left(1 - \frac{\gamma \cdot G_x}{A} \cdot x\right)$. $\quad [9]$ Equation 8 indicates that the group of spins seeing the same frequency offset is located at position z at all X positions before adding the X gradient, and is now located at z'=z·

$$1 \Big/ \left(1 - \frac{\alpha \cdot \gamma \cdot G_x}{A} \cdot x\right)$$

at x location after adding the X gradient. So the inversion bandwidth at position x is shifted along Z direction by a different amount based on the position x and the factor α, causing the inversion region to shear along the Z direction.

Equation 9 defines the new frequency-sweeping range (for simplicity, assume that A'>0 is satisfied), which is a linear function of position x. This results in an inversion thickness as a linear function of x, hence the name WS SS inversion.

Examining the adiabaticity of the new pulse, for the group of spins seen the same frequency offset $C \cdot F_3(t)$ at a given position x (except that it is at a new Z position, z'=z·

$$1 \Big/ \left(1 - \frac{\alpha \cdot \gamma \cdot G_x}{A} \cdot x\right)\bigg),$$

A' is constants, the adiabatic condition is then $$K(\Omega, t) = \left|\frac{\gamma \cdot B_{eff}^{\Omega}(t)}{\dot{\alpha}}\right| = \frac{A'^2}{\gamma \cdot B_1^0} \cdot \frac{[(\gamma \cdot B_1^0 \cdot F_1(t)/A')^2 + (F_2(t) - C/A' \cdot F_3(t))^2]^{3/2}}{|(F_2(t) - C/A' \cdot F_3(t)) \cdot \dot{F}_1(t) - (\dot{F}_2(t) - C/A' \cdot \dot{F}_3(t)) \cdot F_1(t)|} \gg 1, \quad [10]$$

where $B_{eff}^{\Omega}(t)$ is the effective RF field seen by the group of spins at the offset frequency $\Omega$ and $\dot{\alpha}$ is the rate of change of the $B_{eff}^{\Omega}(t)$ orientation in Hz, $\dot{F}_1(t)$, $\dot{F}_2(t)$ and $\dot{F}_3(t)$ are the derivatives of $F_1(t)$, $F_2(t)$ and $F_3(t)$ respectively. The most critical time of the adiabatic condition is when the effective field is crossing the transverse plane ($t=t_\Omega$) for this group of spins at $\Omega(t_\Omega)$, that is, $$C \cdot F_3(t_\Omega) - A' \cdot F_2(t_\Omega) = 0. \quad [11]$$

Then Equation 10 can be simplified to:

$$K(t_\Omega) = \frac{(\gamma \cdot B_1^0 \cdot F_1(t_\Omega))^2}{|A' \cdot \dot{F}_2(t_\Omega) - C \cdot \dot{F}_3(t_\Omega)|} \gg 1. \quad [12]$$

If a constant Z gradient is used in the original SS AFP pulse, e.g. hyperbolic secant (HS) pulse, $\dot{F}_3(t)=0$, so Equation 12 becomes $$K(t_\Omega) = \frac{(\gamma \cdot B_1^0 \cdot F_1(t_\Omega))^2}{|A' \cdot \dot{F}_2(t_\Omega)|} = \frac{1}{1 - \frac{\gamma \cdot G_x}{A} \cdot x} \cdot \frac{(\gamma \cdot B_1^0 \cdot F_1(t_\Omega))^2}{|A \cdot \dot{F}_2(t_\Omega)|}, \quad [13]$$

so the adiabaticity at the most critical time with the X-Y gradient added is modulated by its X position but uniformly squeezed/expanded along the Z direction compared to that with the original SS AFP pulse. For SS AFP pulses with non-constant Z gradient waveforms, given that the adiabatic condition is satisfied at the X position with the largest designated thickness, all other locations with smaller thickness (i.e., smaller A') should have higher adiabaticity. In applications such as PASL, it is typically desired to have the top boundary of the inversion region parallel to the bottom boundary of the imaging region. To do this, the X gradient is offset to zero ($G_x(t_n)=0$) at the end of the pulse, where $t_n$ is the last time point of the pulse, so the on-resonance plane reaches the top flat boundary of the inversion region at the end of the pulse, that is, $$\gamma \cdot G_z \cdot z(t_n) = A. \quad [14]$$

Substituting Equation 13 into Equation 6 and set Equation 6 to zero, then the offset factor α can be calculated:

$$\alpha = F_2(t_n)/F_3(t_n), \quad [15]$$

where $F_2(t_n)$ and $F_3(t_n)$ are the last points of the FM and the Z gradient waveforms of the original SS AFP pulse.

It is noted that rotating the additional gradients in plane (i.e., expanding $G_x$ to $G_{xy}$) will rotate the WS inversion region in plane. This allows for individual control of the inversion thickness at up to three points in X-Y plane.

Exemplary Implementation Methods:

In an exemplary embodiment, the WS inversion is implemented based on an SS hyperbolic secant (HS) inversion pulse with sech/tanh modulation in amplitude and frequency accordingly and a constant Z gradient, which corresponds to a constant off resonance term $\Omega(t)=\Omega_c$. Following the theory above, the in-plane gradient in the WS inversion pulse takes the waveform of the FM in the HS pulse:

$$G_x(t) = G_A \cdot \tan h(\beta t), \quad [16]$$

where β is the truncation factor. The performance of the WS inversion is examined through Bloch simulations and is compared with the conventional SS inversion in phantom experiments.

Exemplary Simulations:

In an exemplary embodiment, the parameters of the HS pulse used in the simulation are: pulse duration=15 ms, $\mu$=25 rad/s, $\beta$=400, temporal resolution=4 $\mu$s, maximal $B_1$=23 $\mu$T and the amplitude of the RF pulse windowed by $\cos^{0.65}(t)$. The Z gradient is set to induce a nominal inversion thickness of 10 cm without the in-plane gradients. The WS inversion pulses using the in-plane gradient waveforms without and with the offset for reaching zero at the end of the pulse are simulated. The evolution of the longitudinal magnetization ($M_z$) within a 20 cm (X) by 20 cm (Z) space is observed during the WS pulses. To investigate the effect of the in-plane gradients on the adiabaticity, the adiabaticity during the WS pulses is calculated for both gradient conditions (without and with the offset). To demonstrate the effect of insufficient $B_1$, the $M_z$ after the application of the WS inversion pulses is also simulated with a maximal $B_1$=15 $\mu$T. The relaxation effects are ignored in the simulations.

Exemplary Phantom Experiments:

In an exemplary embodiment, the WS inversion pulse was implemented on a 3-Tesla GE scanner (Discovery MR750; GE Healthcare, Waukesha, Wis.) with the same parameters as described in the simulations. The images are acquired with an 8-channel receive-only head coil and are complex-reconstructed offline with an in-house developed program.

Stationary Phantom:

The WS inversion pulse is compared with a conventional SS inversion pulse on a stationary gel phantom. The inversion pulses are applied to generate inversion regions along the superior-inferior (S/I) direction. In an exemplary embodiment, the inversion thickness is set to 4 cm for the conventional SS inversion, and 4 cm at the center and 5 cm at L=2 cm for the WS inversion. Coronal images are acquired immediately after the labeling (inversion time (TI)=20 ms) to measure the inversion profiles (label). Control images are also collected as in the PICORE method without the Z and X gradients. Other imaging parameters included: field of view (FOV)=220×220 mm, image matrix=64×64, slice thickness=6 mm, spin echo with spiral readout, repetition time (TR)/echo time (TE)=2 s/10.4 ms, 2 pairs of label/control after 2 dummy repetitions.

The label and control images are averaged through repetitions. A mask based on the magnitude of the MR signal is applied to remove the noisy pixels outside the phantom. The longitudinal magnetization measured under the label condition is projected onto and normalized to that measured under the control condition. The imaginary part is considered as noise and is discarded. The profiles of the normalized longitudinal magnetization at the middle and 2 cm away on both sides of the middle are examined. The full widths at half maximum (FWHMs) are calculated from the profiles to measure the inversion thickness at these locations.

Flow Phantom:

The feasibility of controlling the temporal bolus width in PASL using WS inversion pulse is tested in a flow phantom. The flow phantom consisted of three plastic tubes ("vessels") running parallel on the surface of a cylindrical bottle to simulate three supplying arteries in a PASL experiment. Tap water is running in the phantom driven by a water pump. The phantom is place in the scanner with the flow along the S/I direction. The locations of the "vessels" are arbitrary. The resistance in each "vessel" is adjusted to generate different flow velocities from each other. A cross-section image of the flow phantom is shown in FIG. 4*a*, where the fourth "vessels" has the returning flow.

In an exemplary embodiment, an inversion thickness of 4 cm is used with the conventional SS inversion. Images are collected 1 cm downstream from the inversion region. In order to capture the shape of the label bolus, 60 images are acquired every 28.9 ms, starting at 20 ms and up to 1726 ms after the application of the inversion pulse. Other imaging parameters are: FOV=100×100 mm, image matrix acquired at 48×48 and reconstructed to 64×64, slice thickness=3 mm, gradient echo with spiral readout, TR/TE=4 s/3.8 ms, 10 pairs of label/control after 4 dummy repetitions.

Phase contrast images are acquired at the upper edge of the inversion region to provide estimates of the flow velocities in the labeling region. According to the average velocities in the three "vessels", in an exemplary embodiment, the inversion thickness is set to 4.0 cm, 3.0 cm and 1.9 cm for "vessels" 1, 2 and 3 (V1, V2 and V3 shown in FIG. 4*a*) respectively to yield similar bolus temporal widths with the WS inversion pulse. Other imaging parameters are kept the same as in the conventional SS inversion experiment.

To correct for $T_1$ relaxation, a series of inversion recovery images of the tap water staying stationary in the phantom are collected with TIs=25, 50, 100, 200, 400, 800, 1600, 2400, 3200 and 4800 ms. The measured $T_1$ of the tap water is 3.0 s and is applied in the bolus temporal width analysis.

The label and control images are averaged and normalized as described in the stationary phantom data processing. The normalized signal difference is calculated from subtraction of the label from the control. Small regions of interest (ROIs) are picked at the center of each of the "vessels". Normalized signals are averaged within these ROIs and plotted against time as the measure of the bolus shapes. The FWHM of each profile is estimated from the profile as the estimate of the temporal bolus width. The same analysis is applied on the data with and without the $T_1$ correction.

Exemplary Simulation Results:

FIGS. 2*a*-2*l* are diagrams, results from Bloch simulations, and maps of the minimal adiabaticity during the WS SS AFP pulses. FIGS. 2*a*, 2*c*, 2*e*, 2*g*, 2*i*, 2*k* and 2*b*, 2*d*, 2*f*, 2*h*, 2*j*, 2*l* are from the WS AFP pulses with the shear factor of 0 and 1 accordingly. FIG. 2*a* shows the RF amplitude (201) and the X gradient (202) and the Z gradient (203) of the WS inversion pulses without the gradient offset. FIG. 2*b* show the RF amplitude (204) and the X gradient (205) and the Z gradient (206) of the WS inversion pulses with the gradient offset, respectively The evolution of the longitudinal magnetization, $M_z$, and the movement of the "on-resonance" plane during the WS inversion pulse, where T is the duration of the pulse, are shown in FIGS. 2*c* and 2*d* for WS inversion without and with the gradient offset respectively (FIGS. 2*a* and 2*b*). The final $M_z$ after application of WS inversion at $B_1$=23 $\mu$T is shown in FIGS. 2*e* and 2*f*. With the gradient offset added, the inversion at different X locations is shifted and a horizontal upper boundary is created as expected. The $M_z$ profiles at three X locations are shown in FIGS. 2*g* (207, 208, and 209) and 2*h* (210, 211, and 212), with the corresponding locations depicted in FIGS. 2*e* and 2*f*, respectively. One can see that uniform inversion is achieved within the designated WS regions at $B_1$=23 $\mu$T, when the adiabatic condition was well met. At $B_1$=15 $\mu$T, the inversion at the thickest location among the three is slightly degraded, however, the inversion with smaller inversion thickness designated at the other two locations is not affected, as predicted in the theory section. The minimal adiabaticity maps during the pulses are shown in FIGS. 2*i* and 2*j*, with the profiles at three locations shown in FIGS. 2*k* (213, 214, 215) and 2*l* (216, 217, 218), respectively. In case of insufficient $B_1$, the overall adiabaticity will be reduced. The regions close to the edges are more sensitive to $B_1$ reduction, where the adiabaticity may fall below the adiabatic threshold first, resulting in incomplete inversion, as shown with $B_1=15$ μT here. However, as pointed out in the theory section, as long as the adiabatic condition is satisfied at the location with the largest inversion thickness, all other locations should have higher adiabaticity (FIGS. 2k and 2l) and therefore more robust inversion. The minimal adiabaticity maps also show the shifting at different X locations with the gradient offset added.

Figures 3A, 3B:
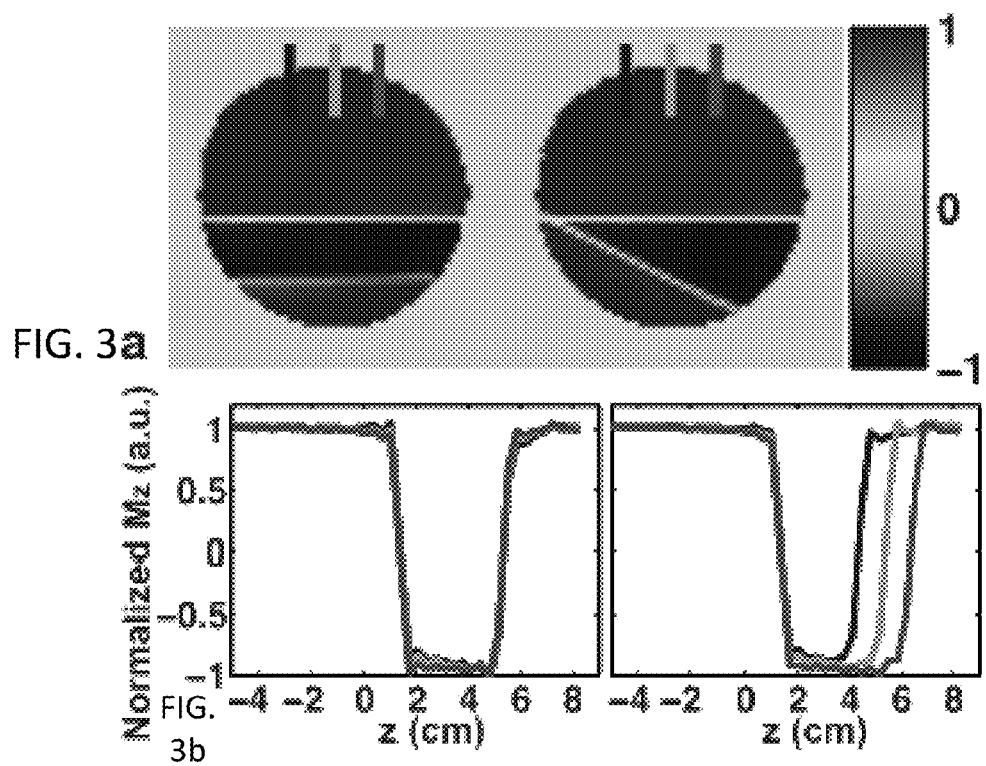

Exemplary Phantom Experiment Results:

Stationary Phantom:

The normalized $M_z$ maps using the conventional SS and the WS inversion pulses are shown in FIG. 3a, with the inversion profiles at the middle and 2 cm away on both sides shown in FIG. 3b. The FWHMs of the inversion thickness are 3.9 cm, 4.0 cm and 4.0 cm with the conventional SS inversion, and 3.0 cm, 4.0 cm and 5.0 cm with the WS inversion at the locations depicted with blue, green and red lines. The WS inversion pulse worked as expected. Relatively uniform inversion is achieved within the inversion regions with both pulses.

Flow Phantom:

The velocity map of the flow phantom at the upper edge of the inversion region is shown in FIG. 4a. The averaged velocities are 7.1 cm/s, 5.4 cm/s and 3.4 cm/s in V1, V2 and V3 respectively. The averaged signal difference between the label and the control conditions at different TI times is shown in FIGS. 4b and 4c, before and after $T_1$ correction respectively. The delays of the label arrival are the same in the same "vessel" using the conventional SS inversion and the WS inversion, and are measured as 0.10 s, 0.15 s and 0.24 s in V1, V2 and V3 respectively. Given the 1 cm gap between the inversion and the imaging regions, these delays corresponded to velocities of 10.0 cm/s, 6.7 cm/s and 4.2 cm/s, and matched well with the highest velocities around the centers of the "vessels" in FIG. 4a. This indicates that the WS inversion pulse is able to generate the same flat upper boundary as the conventional inversion pulse did, therefore leaving the transit delays unchanged as using the conventional SS inversion labeling. This feature is desirable in PASL experiments. It is clearly seen with WS AFP inversion pulses, the bolus temporal width in each "vessel" is under control and well matched to each other.

For the conventional SS inversion, the FWHMs are measured 0.51 s, 0.71 s and 1.00 s before $T_1$ correction and 0.53 s, 0.74 s and 1.04 s after $T_1$ correction; for the WS inversion, the FWHMs are 0.51 s, 0.51 s and 0.51 s before $T_1$ correction and 0.53 s, 0.52 s and 0.52 s after $T_1$ correction. Compared to the conventional SS inversion pulse, the WS inversion pulse is able to control the bolus temporal widths to generate a uniform length of boli in these "vessels". This clearly demonstrates the feasibility of using the WS inversion pulse to independently control the inversion thickness and the bolus temporal widths at up to three in-plane locations as expected.

An image of averaged ASL signals and a velocity map at the imaging plane are shown in FIGS. 5a and 5b, respectively. FIGS. 5a and 5b are zoomed-in images of averaged ASL signals and velocity map acquired at 2 cm distal from the inversion region in the human subject, with the arteries of interest labeled. The venous flow velocities (negative values) were capped at −10 cm/s for a better visualization of the positive flows of interest. The averaged velocities are 14.7, 17.9, 11.9, and 7.5 cm/s in RICA, LICA, LVA, and RVA, respectively. The averaged ASL signals at different Tis after T1 correction are shown in FIG. 5c. FIG. 5c shows normalized ASL (control-tag) signal in each artery after T1 correction, acquired with conventional SS AFP and WS AFP inversion pulses. Note that with WS AFP inversion pulses, the temporal widths of boluses can be controlled and matched to each other. The results showed similar patterns as in the flow phantom experiments. The delays of the label arrival in the arteries were unchanged between the conventional SS inversion and the WS inversion, except that the ASL signal arose slightly earlier in the RICA with the WS inversion. Nevertheless, the arrival times for the majority of the label (measured from the main upslope) remained almost unchanged as expected and were measured as 0.13, 0.05, 0.21, and 0.27 s with the conventional SS inversion and 0.14, 0.05, 0.21, and 0.28 s in RICA, LICA, LVA, and RVA, respectively.

For the conventional SS inversion, the FWHMs were measured as 0.75, 0.78, 0.99 s, and 1.12 s. For the WS inversion, the FWHMs were 0.75, 0.73, 0.58, and 0.69 s. Compared with the conventional SS inversion pulse, the WS inversion pulse was able to reduce the temporal widths of the boluses in both vertebral arteries to largely match that in the ICAs, generating a relatively uniform temporal width in four feeding arteries with different velocities. However, due to the simple approximation of using the averaged velocity and the middle point of the two vertebral arteries for the third point to define the WS inversion, the temporal width of the bolus in the LVA was slightly shorter than desired. This may be improved by adjusting the inversion thickness and the location of the third point in the prescription.

By adding in-plane gradients in a conventional SS HS inversion pulse with a constant Z gradient, the shape of the inversion region could be altered from a slab to a wedge, resulting in different inversion thickness at different locations. As discussed in the sections above, the inversion thickness at different in-plane location is independent of the off resonance $\Omega(t)$, which could be from a through-plane gradient applied with the SS AFP. This means that the same principle is applicable with other types of SS AFP inversion pulses with non-constant Z gradient, such as VERSE-transformed SS AFP, frequency offset corrected inversion, gradient-modulated OIA, and so forth, and these are confirmed by Bloch simulations (not shown here).

As discussed in the sections above, given an SS AFP pulse, the adiabaticity at the most critical time decreases as the intended inversion thickness increases, so the largest inversion thickness with sufficient efficiency is limited by the capability of the original SS AFP pulse. As long as the adiabatic condition is maintained where the largest thickness is requested, efficient inversion should be achieved within the whole region of interest. In locations where the inversion thickness is too large, the inversion efficiency reduces first in regions with relatively low adiabaticity. For example, with an SS HS pulse, the efficiency reduces first in regions around the edges as shown in FIGS. 2g and 2h; with an SS AFP pulse with relatively uniform adiabaticity along Z, such as GOIA, the efficiency reduction will be relatively uniform along Z. With the cosine-windowed SS HS pulse in the simulation, the efficiency reduces first in regions around the boundaries, as shown in FIGS. 2g and 2h.

The shape of the X-Y gradients resembles that of the frequency-swept function (or the combination with the Z gradient if shearing the inversion region is required) of the original AFP pulse to maintain the adiabatic properties. However, unlike the FM (typically implemented as phase modulation), the gradient pulses are subject to hardware limitations such as slew rate. It should be noted that if the added X-Y gradient waveform cannot follow the designated shape given by Equation [6] due to hardware limitation/imperfection, the pulse would need to be modified to satisfy the constraints. However, under typical circumstances, this is unlikely to pose a significant limitation. In the example in the simulation above, the peak gradient and slew rate were 0.372 and 0.15 T/m/s, respectively.

The additional in-plane gradient pulses can be applied in PASL methods, such as EPISTAR, FAIR, PICORE, and their modifications, under the label condition. To obtain the control images with magnetization transfer effect compensation, the additional in-plane gradient pulses can simply be turned off. However, if eddy current effects limit one to use EPISTAR, the same additional in-plane gradients can be applied under the control condition to keep the gradient pulses identical under both label and control conditions.

In the flow phantom experiments, it has been demonstrated that the WS inversion region can be rotated in-plane by rotating the additional XY gradients to generate three different inversion thickness to match the flow velocities at different locations, therefore controlling the bolus temporal width in PASL experiments. This should be sufficient for perfusion measurement in brain, where left and right internal carotid and the vertebrobasilar arteries are the main feeding arteries. In practice, because of the tortuosity of the feeding arteries, in order to control the bolus temporal width accurately, the velocities and the lengths of the feeding arteries in the inversion region should be measured and the inversion thickness should be assigned accordingly. Once set, the inversion thickness can be scaled accordingly if the velocities in these vessels should change.

Given a typical location and a thickness of the inversion region in PASL experiments, the proximal boundary of the inversion region is likely to land on the vertebral arteries, requiring individual control of inversion thicknesses at four locations, as we had tested and demonstrated in the human experiments. As an approximation, the location of the middle point and the averaged velocity of the two vertebral arteries can be used. This could result in compromised accuracy on the control of the temporal widths of the boluses in vertebral arteries as shown in the human experiments. However, given relatively low and likely similar velocities in the vertebral arteries compared with that in the carotid arteries, this effect may not be significant. In addition, adjustment of the inversion thickness and the location to prescribe the WS inversion region can be used to minimize the inaccuracy.

The WS inversion pulse is capable of handling relatively small spatial separations between vessels (e.g., between the carotid and the vertebrobasilar arteries. For example, if the desired inversion thicknesses are 15 and 7.5 cm in the carotid and the vertebrobasilar arteries, respectively, (assuming a velocity ratio of 2:1), a small spatial separation of 1 cm between them along the anterior-posterior direction will require the peak anterior-posterior gradient to be 3.72 mT/m. This is well within the capability of a typical scanner.

Note that due to the small size of the flow phantom, the velocities are chosen to be low to generate relatively long temporal widths of boluses for minimizing potential inaccuracy in the temporal width measurements. For high velocities in vivo, the inversion thicknesses can be linearly scaled up to match the velocities. This scaling will not affect the performance of the pulse, as demonstrated in the human experiments.

With the bolus temporal width in each feeding artery under control, PASL labeling can be performed more rapidly and more efficiently than it is done currently. For example, because the time needed to apply one PASL labeling is typically negligible (<30 ms) compared to the image acquisition for the whole brain (~several hundred ms), the bolus temporal width can be set to match the TR (mainly image acquisition), so that the labeling process (label/control) can be applied on the arterial blood continuously and seamlessly. This way, the arterial blood is constantly contributing to the ASL signal the whole time during the PASL experiment, on either the label or the control side, maximizing the utility of arterial blood and therefore the tSNR. At the same time, the temporal resolution of the ASL signal can be significantly improved. However, because the arterial blood under the label and the control conditions contributes to the MR signal in opposite directions, in practice, one may allow a few labels/controls to be applied in a row for the ASL signal to accumulate in the tissue to improve the SNR in each measurement. This will reduce the temporal resolution gain for each independent ASL measurement (a complete labels/controls cycle), but it may still provide higher temporal resolution in ASL measurements in addition to the tSNR improvement. This should be beneficial in applications where the dynamic information of the perfusion is of interest, such as in functional studies.

The transit delays depend on the distance between the upper boundary of the inversion region and the perfused sites. With the upper boundary parallel to the imaging region in PASL using WS inversion as in PASL using conventional SS inversion, transit delays will remain unchanged. If a PASL experiment described above is performed, the transit delay information can be extracted from the first few measurements sampled at high temporal resolution. In addition, if the transit delays change during the experiment, due to activation for example, these changes may be inferred from the dynamic behavior of the ASL signals acquired when those change occur.

The above disclosure includes a novel method to modulate the inversion thickness at different in-plane gradient while maintaining the adiabatic properties of the original SS AFP pulses has been proposed. An implementation of generating WS inversion with an SS HS pulse and an additional in-plane gradient pulse has been demonstrated through Bloch simulations and phantom experiments. It is capable of controlling the bolus temporal width in PASL experiments. This method should maximize the tSNR and improve the temporal resolution in PASL experiments.

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

The described systems, apparatus and techniques can be implemented in electronic circuitry, computer hardware, firmware, software, or in combinations of them, such as the structural means disclosed in this specification and structural equivalents thereof. This can include at least one computer-readable storage medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

Only a few implementations are disclosed. However, variations and enhancements of the disclosed implementations and other implementations can be made based on what is described and illustrated in this specification.

We claim:

1. A method of magnetic resonance imaging (MRI) by operating an MRI system, comprising:
   generating RF pulses that, when applied to a tissue of interest via the MRI system, create a slab within the tissue of interest in which magnetic inversion is generated;
   modifying a shape of the slab having the magnetic inversion by modulating a plurality of in-plane gradients on a thickness of the slab, wherein the modifying the shape of the slab comprises applying a hyperbolic secant inversion pulse with sech/tanh modulation in amplitude and frequency and a Z gradient;
   measuring one or more of velocities and lengths of at least some of a plurality of feeding arteries in the inversion slab; and
   assigning an inversion thickness of the inversion slab to at least some of the plurality of feeding arteries by matching a temporal bolus width with an inter-pulse spacing of the at least some of the plurality of feeding arteries.

2. The method of claim 1, wherein the generating of the slab having magnetic inversion comprises:
   applying a constant gradient pulse;
   applying an adiabatic fast passage radiofrequency pulse for slice-selection, wherein a frequency of the adiabatic fast passage radiofrequency pulse moves from one side to the other within its frequency sweeping range; and
   applying an on-resonance frequency to generate a plane in space where magnetization is rapidly perturbed.

3. The method of claim 1, wherein the Z gradient is a constant Z gradient.

4. The method of claim 1, wherein the Z gradient is a non-constant Z gradient.

5. The method of claim 1, wherein modifying the shape of the inversion slab results in a wedge-shaped inversion.

6. The method of claim 1, further comprising:
   adding a linear modulation along a predetermined direction to a frequency modulation function and a Z gradient waveform to maintain adiabatic properties of the adiabatic fast passage radiofrequency pulse for slice-selection.

7. The method of claim 6, wherein the Z gradient waveform is a constant Z gradient waveform.

8. The method of claim 6, wherein the Z gradient waveform is a non-constant Z gradient waveform.

9. The method of claim 1, wherein the shape of the inversion slab is modified when one or more velocities in one or more blood vessels change.

10. A non-transitory computer-readable storage medium embodying instructions to cause a magnetic resonance imaging system to perform operations comprising:
    generating an inversion slab;
    modifying a shape of the inversion slab by modulating a plurality of in-plane gradients on a thickness of the inversion slab, wherein the modifying the shape of the slab comprises applying a hyperbolic secant inversion pulse with sech/tanh modulation in amplitude and frequency and a Z gradient;
    measuring one or more of velocities and lengths of at least some of a plurality of feeding arteries in the inversion slab; and
    assigning an inversion thickness of the inversion slab to at least some of the plurality of feeding arteries by matching a temporal bolus width with an inter-pulse spacing of the at least some of the plurality of feeding arteries.

11. The non-transitory computer-readable storage medium of claim 10 wherein the generating of the inversion slab comprises:
    applying a constant gradient pulse;
    applying an adiabatic fast passage radiofrequency pulse for slice-selection, wherein a frequency of the adiabatic fast passage radiofrequency pulse moves from one side to the other within its frequency sweeping range; and
    applying an on-resonance frequency to generate a plane in space where magnetization is rapidly perturbed.

12. The non-transitory computer-readable storage medium of claim 10, wherein the Z gradient is a constant Z gradient.

13. The non-transitory computer-readable storage medium of claim 10, wherein the Z gradient is a non-constant Z gradient.

14. The non-transitory computer-readable storage medium of claim 10, wherein modifying the shape of the inversion slab results in a wedge-shaped inversion.

15. The non-transitory computer-readable storage medium of claim 10 further comprises:
    adding a linear modulation along a predetermined direction to a frequency modulation function and a Z gradient waveform to maintain adiabatic properties of the adiabatic fast passage radiofrequency pulse for slice-selection.

16. The non-transitory computer-readable storage medium of claim 15, wherein the Z gradient waveform is a constant Z gradient waveform.

17. The non-transitory computer-readable storage medium of claim 15, wherein the Z gradient waveform is a non-constant Z gradient waveform.

18. The non-transitory computer-readable storage medium of claim 10, wherein the shape of the inversion slab is modified when one or more velocities in one or more blood vessels change.

19. A magnetic resonance imaging (MRI) system, comprising:
    a scanner comprising a magnet, gradient coils and a radio frequency (RF) system to perform operations comprising:
       applying a gradient field and generating RF pulses to a tissue of interest to create a slab within the tissue of interest in which magnetic inversion is generated,
       modifying a shape of the slab having the magnetic inversion by modulating a plurality of in-plane gradients on a thickness of the slab, and acquiring magnetic resonance signals based on the applied RF pulses, wherein modifying the shape of the inversion slab comprises applying a hyperbolic secant inversion pulse with sech/tanh modulation in amplitude and frequency and a Z gradient; and
    a data processing system in communication with the scanner to receive the acquired magnetic resonance signals and process the received magnetic resonance signal to generate MRI images of the tissue of interest to improve the temporal signal-to-noise ratio (tSNR), the data processing system configured to:
  measure one or more of velocities and lengths of at least some of a plurality of feeding arteries in the inversion slab; and
  assign an inversion thickness of the inversion slab to at least some of the plurality of feeding arteries by matching a temporal bolus width with an inter-pulse spacing of the at least some of the plurality of feeding arteries.

20. The system of claim 19, wherein the generating of the slab having magnetic inversion comprises:
  applying a constant gradient pulse;
  applying an adiabatic fast passage radiofrequency pulse for slice-selection, wherein a frequency of the adiabatic fast passage radiofrequency pulse moves from one side to the other within its frequency sweeping range; and
  applying an on-resonance frequency to generate a plane in space where magnetization is rapidly perturbed.

21. The system of claim 19, wherein the Z gradient is a constant Z gradient.

22. The system of claim 19, wherein the Z gradient is a non-constant Z gradient.

23. The system of claim 19, wherein modifying the shape of the slab results in a wedge-shaped inversion.

24. The system of claim 19, wherein the scanner is configured to:
  add a linear modulation along a predetermined direction to a frequency modulation function and a Z gradient waveform to maintain adiabatic properties of the adiabatic fast passage radiofrequency pulse for slice-selection.

25. The system of claim 21, wherein the Z gradient waveform is a constant Z gradient waveform.

26. The system of claim 21, wherein the Z gradient waveform is a non-constant Z gradient waveform.

27. The system of claim 19, wherein the shape of the slab is modified when one or more velocities in one or more blood vessels change.

* * * * *